_United States Patent_ [19]

Yarmark

[11] Patent Number: 4,861,943
[45] Date of Patent: Aug. 29, 1989

[54] ENCLOSURE FOR THERMAL PROTECTOR AND METHOD OF ASSEMBLY

[75] Inventor: Martin J. Yarmark, Huntingdon Valley, Pa.

[73] Assignee: Triboro Electric Corporation, Doylestown, Pa.

[21] Appl. No.: 119,470

[22] Filed: Nov. 12, 1987

[51] Int. Cl.[4] .............................................. H05K 5/00
[52] U.S. Cl. .............................. 174/52.1; 174/138 G; 206/334; 337/380; 439/567
[58] Field of Search ............ 174/52 R, 138 F, 138 G; 337/112, 327, 380, 398, 414; 362/457, 802; 248/27.3; 338/197; 206/328, 334; 439/557, 567

[56]  References Cited

U.S. PATENT DOCUMENTS

| | | | |
|---|---|---|---|
| 3,253,034 | 5/1966 | Taylor | 174/138 G X |
| 3,272,908 | 9/1966 | Beecher | 174/52 R |
| 3,335,387 | 8/1967 | Mueller | 439/567 X |
| 3,430,177 | 2/1969 | Audette | 337/380 X |
| 3,430,185 | 2/1969 | Sitzler et al. | 174/138 F X |
| 4,297,668 | 10/1981 | Place | 337/380 X |
| 4,314,223 | 2/1982 | Kristofek | 337/381 X |
| 4,446,451 | 5/1984 | Boulanger | 337/380 |
| 4,583,640 | 4/1986 | Gillem | 206/328 |
| 4,710,743 | 12/1987 | Givler | 337/380 |

_Primary Examiner_—Arthur T. Grimley
_Assistant Examiner_—David A. Tone
_Attorney, Agent, or Firm_—Blum Kaplan

[57]  ABSTRACT

An electrically insulated enclosure for a thermal protector to be used in a lighting fixture includes a body having openings at both ends with a trench therein for guiding the thermal protector through the body. A resilient tab extending from the interior top surface of the body and stops disposed within and near the front of the body lockingly secure the protector to the body. An arm and a pair of legs extending from the bottom of the body serve as fasteners to clip the body to a flat plate stamped within the lighting fixture.

10 Claims, 1 Drawing Sheet

ENCLOSURE FOR THERMAL PROTECTOR AND METHOD OF ASSEMBLY

BACKGROUND OF THE INVENTION

This invention relates to an enclosure for a thermal protector, and especially to an enclosure for a shut-off switch for use in a lighting fixture.

Shut-off switches are typically connected electrically in series with an element or device which may experience high temperatures such as but not limited to an incandescent lamp. When the temperature sensed by the switch exceeds a predetermined value, the switch electrically opens thereby serving to protect the circuitry and the fixture itself from overheating.

For attaching the switch to a lighting fixture, the shut-off switch is first wrapped in a heat shrunk insulated sleeve. The wrapped shut-off switch is then placed in an open-ended rectangular metallic box. The box has two arms for holding the wrapped shut-off switch therein. Finally, a plurality of legs extending from the open-ended periphery of the box serve as fasteners for clipping the box to a metal plate which is stamped within the lighting fixture frame.

It is therefore desirable to provide an improved enclosure for a shut-off switch attachable to a lighting fixture which is less costly and cumbersome to assemble than as described above.

SUMMARY OF THE INVENTION

In accordance with the invention, an enclosure for a thermal protector includes an electrically insulating housing which includes a leg protruding from the interior top surface of the housing for securing the thermal protector to a predetermined position within the housing. The enclosure also includes an arm and a plurality of legs protruding from the bottom exterior surface of the enclosure for connecting the housing to a flat plate stamped within the lighting fixture. A pair of tracks within the housing guide the thermal protector through and to its predetermined position within the housing.

Accordingly, it is an object of this invention to provide an improved enclosure for a thermal protector and method of assembly which is less costly to assemble than is presently available.

It is another object of the invention to provide a closure for a thermal protector which is more simply, easily and quickly assembled to a lighting fixture than is presently available.

Still other objects and advantages of the invention will in part be obvious and will in part be apparent from the specification.

The invention accordingly comprises several steps and the relation of one or more of such steps with respect to each of the others, and the device embodying features of construction, combination of elements and arrangements of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in conjunction with the accompanying drawings, in which.

DESCRIPTION OF A PREFERRED EMBODIMENT

Figure 1:
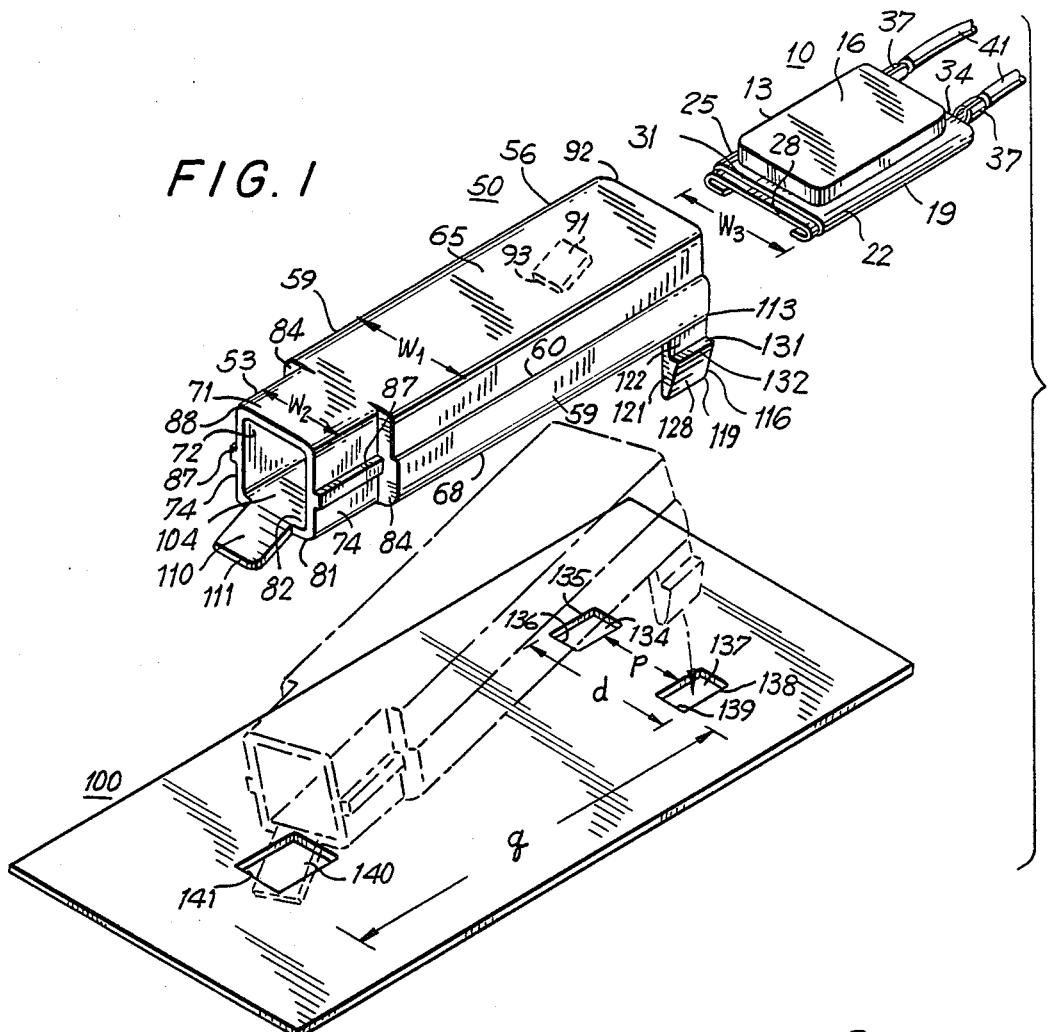
FIG. 1 is an exploded, perspective view of a thermal protector enclosure assembly in accordance with the invention.
Figure 2:
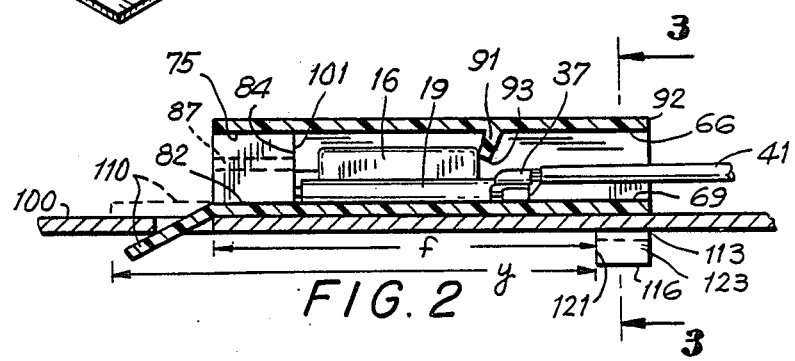
FIG. 2 is a side elevational view partially in cross-section of the assembly of FIG. 1.
Figure 3:
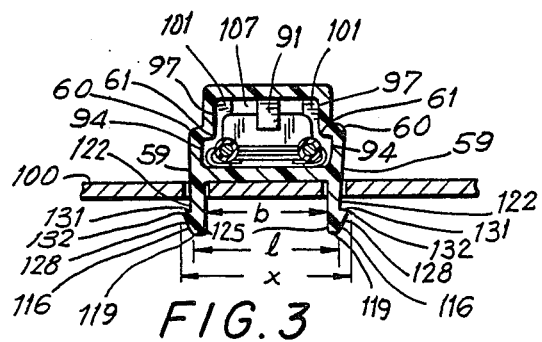
FIG. 3 is a rear elevational view in cross-section taken along the lines 3—3 of FIG. 2.

As shown in FIGS. 1-3, a thermal protector such as shut-off switch 10 is housed within an enclosure 50 which is connected to a plate 100 located within the interior of a lighting fixture (not shown).

Thermal switch 10 includes an outer cover 13 having a raised box-like central protrusion 16 and a flattened skirt 19 surrounding central portion 16. Skirt 19 includes a pair of rounded sides 22 and 25, a front edge 31 and a back edge 34. A plastic film serves as a thermally or electrically insulating material 28 formed of a material such as Mylar, a trademark of E.I. duPont de Nemours & Co., Inc., within switch 10 and extends slightly beyond front edge 31 and back edge 34 of skirt 19. A pair of lugs 37 integrally connected to switch 10 by stamping or the like protrude beyond rear edge 34 and plastic film 28. Attached to lugs 37 is a pair of wires 41 which connect switch 10 electrically in series between the lighting fixture and a power source (not shown).

Enclosure 50 is a hollow body having an open-ended front section 53 and an open-ended rear section 56. Rear section 56 includes a pair of side walls 59, a top wall 65, and a bottom wall 68. For manufacturing purposes only, each of the pair of side walls 59 has a stepped exterior surface with a step 60 centrally positioned thereon. Top wall 65 has a flat exterior surface with a width $w_1$. Bottom wall 68 has a flat exterior surface which is slightly larger in width than width $w_1$ due to the stepped exterior surfaces of side walls 59. Each pair of adjacent walls of rear section 56 are substantially at right angles to each other. Front section 53 has a top wall 71, a pair of side walls 74 and a bottom wall 81, all of which have flat exterior surfaces and approximately the same width $w_2$ with adjacent walls substantially at right angles to each other. Front section 53 and rear section 56 are molded as one integral piece with top walls 71 and 65 of front section 53 and rear section 56 being coplanar, respectively. Similarly, bottom walls 81 and 68 of front section 53 and rear section 50 are coplanar, respectively.

Inasmuch as width $w_2$ is less than width $w_1$, side walls 74 of front section 53 are located inwardly from side walls 59 of rear section 56 producing a stepped configuration and creating a tapered appearance near the front of enclosure 50. A pair of end walls 84 having flat exterior surfaces are integrally connected to side walls 59 and 74, top wall 65 and bottom wall 68 at right angles to each. Side walls 59 and 74 extend in substantially parallel planes. Each of the pair of steps 60 is parallel to top wall 65 and runs along the entire length of rear section 56 extending from a distal end 92 of rear section 56 to each of the pair of end walls 84. A pair of ledges 87 used for molding front section 53 are centrally positioned on side walls 74 and extend from each of the pair of end walls 84 to a distal end 88 of front section 53.

As shown in FIG. 2, an interior surface 66 of top wall 65 is substantially flat and includes a resilient rectangular tab 91 sloping downwardly therefrom toward front section 53. Tab 91 is located approximately one third of the perpendicular distance between distal end 92 of rear section 56 and either of the pair of end walls 84 as measured from distal end 92. Bottom wall 68 includes a flat interior surface 69. In its nonflexed position, a distal end 93 of tab 91 is approximately one half the perpendicular distance between interior surfaces 66 and 69.

As shown in FIG. 3, side walls 59 include a pair of diametrically opposed inwardly stepped interior surfaces 61 having a pair of parallel diametrically opposing lower steps 94 and a pair of parallel diametrically opposing upper steps 97. Steps 94 and 97 are substantially parallel to each other and substantially perpendicular to interior surfaces 66 and 69. Steps 94 and interior surface 69 of bottom wall 68 therefore resemble an open-ended trench.

The width of switch 10 denoted by "$w_3$" is slightly less than the perpendicular distance between steps 94 but is greater than width $w_2$. End walls 84 have flat interior surfaces 101 which rise perpendicularly from interior surface 69 of bottom wall 68 to interior surface 66 of top wall 65 and are substantially perpendicular to and integral with steps 94 and 97. Top wall 71, side walls 74 and bottom wall 81 of front section 53 have flat interior surfaces 72, 75 and 82, respectively. Interior top surfaces 72 and 66 and interior bottom surfaces 82 and 69 of front section 53 and rear section 56 are coplanar, respectively.

Enclosure 50 also includes an opening 104 and an opening 107 located at distal ends 88 and 92 of front section 53 and rear section 56, respectively. Opening 104 has a substantially square shape. A resilient arm 110 extends outwardly from bottom wall 81 of front section 53 and includes a tip 111. Arm 110 in its unbent position is substantially coplanar with bottom wall 81. Opening 104 has a perimeter formed from the interior surfaces 72, 75 and 82. Opening 107 has a perimeter formed by both pairs of steps 94 and 97 and interior surfaces 66 and 69 of top wall 65 and bottom wall 68, respectively.

Extending from a pair of corners 113 of bottom wall 68 and adjacent to distal end 92 of rear section 56 are a pair of legs 116. Each leg 116 extends substantially perpendicular to bottom wall 68 having a beveled distal end 119. An exterior planar side surface 122 and an interior planar side surface 125 of each leg 116 are substantially parallel to each other. A front surface 121 and a rear surface 123 of each leg 116 each have a substantially single wing arrowhead configuration. The single wings are formed from outwardly sloping surfaces 128 which begin at the beveled distal ends 119 and terminate at ledges 131. Sloping surface 128 and ledge 131 of each leg 116 meet at an edge 132. Each ledge 131 connects exterior planar side surface 122 to one of the two sloping surfaces 128 and is substantially parallel to steps 60 of side walls 59.

As shown in FIG. 3, the perpendicular distance between the pair of interior planar side surfaces 125 of legs 116 is represented by letter "b" and the perpendicular distance between exterior planar side surfaces 122 of legs 116 is denoted by letter "l". Edges 13 are separated from each other by a straight line distance "x". As shown in FIG. 2, the perpendicular distances from each front surface 121 of each leg 116 to distal edge 88 of front section 53 and to tip 111 of arm 110 in its unflexed position are denoted by letters "f" and "y", respectively.

Referring once again to FIG. 1, plate 100 has a substantially flat rectangular shape with openings 134, 137 and 140. Openings 134 and 137 are dimensioned to receive legs 116 and are separated from each other by a perpendicular distance denoted by the letter "p". Openings 134 and 137 have outer edges 135 and 138, respectively, which are separated from each other by a perpendicular distance denoted by the letter "d". Rectangular openings 134 and 137 also include front edges 136 and 139, respectively, which are in the same parallel plane and separated from a front edge 141 of opening 140 by a perpendicular distance denoted by the letter "q". Edge 141 is parallel to edges 136 and 139. Opening 140 is substantially centered between openings 134 and 137. In one preferred embodiment, distance p is about 0.3 inches, distance d is about 0.5 inches, and distance f is about 1.35 inches. Openings 134 and 137 are each about 0.2 inches by 0.1 inches. Opening 140 is about 0.2 inches by 0.25 inches.

As will be appreciated hereinafter, distance b is less than distance d but greater than distance p. Distance l is slightly less than distance d and distance d is less than distance x. Distance q is greater than distance f but less than distance y.

Referring now to all the FIGS., assembly of shut-off switch 10 within enclosure 50 which is then secured to plate 100 is as follows. Switch 10 is inserted through opening 107 into enclosure 50 with sides 22 and 25 of skirt 19 sliding along interior surface 69 of bottom wall 68 between steps 94. Thus, interior surface 69 and steps 94 serve to guide switch 10 through enclosure 50. As switch 10 proceeds further within enclosure 50, central portion 16 comes into contact with and presses against distal end 93 of tab 91 and thus bends tab 91 toward front section 53 and interior surface 66 of top 65. As central protrusion 16 passes beyond contact with distal end 93 of tab 91, tab 91 assumes its original unbent position which blocks switch 10 from exiting enclosure 50 through opening 107. Due to width $w_3$ of switch 10 being greater than width $w_2$ of front section 53, switch 10 is unable to exit through opening 104 of front section 53. Furthermore, walls 84 serve as stops to any further forward movement of switch 10 through enclosure 50.

With switch 10 now locked within enclosure 50, enclosure 50 is attached to plate 100 by first inserting arm 110 of front portion 53 within opening 140 so as to extend tip 111 and a portion of arm 110 beneath plate 100 and beyond edge 141 of opening 140 as shown by the phantom lines in FIG. 1. Legs 116 of enclosure 50 are then rocked toward openings 134 and 137 with tab 110 bending against edge 141 of opening 140. As legs 116 are inserted within openings 134 and 137, beveled distal ends 119 press against outer edges 135 and 138 of openings 134 and 137, respectively. Due to the resilient nature of legs 116, legs 116 are continually pressed towards each other as sloping surfaces 128 slide against outer edges 136 and 138 of openings 134 and 137, respectively. As legs 116 are further pushed through openings 134 and 137, outer edges 136 and 138 pass beyond sloping surfaces 128 and reach ledges 131. Legs 116 now assume their unbent position with ledges 131 beneath plate 100 and beyond outer edges 136 and 138. Accordingly, arm 110 and ledges 131 of legs 116 lockingly engage enclosure 50 to plate 100.

Thermal switch 10 is nominally rated at between 80° C. to 150° C., that is, switch 10 must be capable of withstanding temperatures ranging from 80° C. to 150° C. prior to cut-out of switch 10. Thermal switches as described above are manufactured by Texas Instruments Incorporated under part numbers beginning with the code 7 AM. Enclosure 50 is preferably made from a thermoplastic capable of withstanding temperatures above the cut-off temperature of switch 10. The thickness of arm 110 is less than the thickness of front section 53 to provide the required resiliency for the former.

As now can be readily appreciated, the invention provides an insulated enclosure for a thermal protector for use in a lighting fixture which is simply and easily mountable to a lighting fixture, readily and quickly secures the thermal protector within the enclosure and is less costly than presently available in the art. Advantageously, openings 104 and 107 also provide for heat generated within enclosure 50 to escape therefrom and conform to Underwriter Laboratories Standard 1571, paragraph 20 regarding incandescent lighting fixtures.

It will thus be seen that the objects set forth above, and those made apparent from the preceding description, are efficiently obtained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all the generic and specific features of the invention herein described, and all statements of the scope of the invention which, as a matter of language, might be said to fall therebetween.

What is claimed is:

1. An enclosure for a thermal protector comprising: an electrically insulating housing having an exterior surface, locking means for securing the thermal protector to a predetermined position within the housing, an open front end, an open rear end operable for receiving said thermal protector and a hollow interior formed by a pair of side walls, a top wall and a bottom wall, said interior side walls being step shaped, said bottom and top walls having continuous, uninterrupted planar surfaces and extending parallel to each other; and
clip means extending from and integral with the exterior surface of the housing for connection of the housing to an object;
wherein the locking means include a resilient tab protruding downwardly from the top interior wall of the housing.

2. The enclosure of claim 1, wherein the locking means further comprise one or more stops within the interior of the housing and near the open front end thereof.

3. The enclosure of claim 2, wherein the one or more stops rise from the bottom interior wall to the top interior wall of the housing.

4. An enclosure for a thermal protector comprising: an electrically insulating housing having an exterior surface, locking means for securing the thermal protector to a predetermined position within the housing, an open front end, an open rear end operable for receiving said thermal protector and a hollow interior formed by a pair of side walls, a top wall and a bottom wall, said interior walls being step shaped, said bottom and top walls having continuous, uninterrupted planar surface and extending parallel to each other; and
clip means extending from and integral with the exterior surface of the housing for connection of the housing to an object;
wherein the clip means include a plurality of resilient legs and a resilient arm extending outwardly from the front end of the housing.

5. An enclosure for a thermal protector comprising:
an electrically insulating hollow housing having an open front end, an open rear end, a top interior surface, a bottom interior surface, a pair of rear corners, locking means for securing the thermal protector to a predetermined position within the housing and side walls with stepped interior surfaces for guiding in combination with the bottom interior surface the thermal protector to its predetermined position within the housing; said locking means including both a resilient tab protruding downwardly from the top interior surface of the housing and at least one stop rising from the bottom interior surface to the top interior surface of the housing; and
clip means for connection of the housing to a flat plate and having a resilient arm extending outwardly from the bottom of the open front end of the housing and a pair of resilient legs protruding from the rear corners of the housing with each leg having a beveled distal end and a ledge located on the outside portion of the leg.

6. A method of enclosing a thermal protector comprising:
sliding the thermal protector into an open ended and along tracks within an electrically insulating housing having a hollow interior formed by a pair of step shaped side walls, an interior top wall and an interior bottom wall wherein said interior top and bottom walls have continuous, uninterrupted planar surfaces and extend parallel to each other and wherein said interior side and bottom walls serve as the tracks;
bending a resilient tab extending from the interior top surface through contact with and in the same direction as the sliding thermal protector; and
locking the thermal protector within the housing by sliding at least a portion of the thermal protector beyond the tab.

7. The method of claim 6, further including providing at least one stop within the hollow interior to prevent further movement of the protector toward the front of the housing.

8. A method of connecting a thermal protector to a lighting fixture comprising:
sliding the thermal protector into an open ended and along tracks within an electrically insulating housing having a hollow interior formed by a pair of step shaped side walls, an interior top wall and an interior bottom wall wherein said interior top and bottom walls have continuous, uninterrupted planar surfaces and extend parallel to each other and wherein said interior side and bottom walls serve as the tracks;
bending a resilient tab extending from the interior top surface through contact with and in the same direction as the sliding thermal protector;
locking the thermal protector within the housing by sliding at least a portion of the thermal protector beyond the tab; and
attaching the housing to a flat plate located within the lighting fixture.

9. An enclosure for a thermal protector comprising:
an electrically insulating hollow housing having an open front end, an open rear end, a top interior surface, a bottom interior surface, locking means for securing the thermal protector to a predetermined position within the housing, and side walls with stepped interior surfaces for guiding in combination with the bottom interior surface the thermal protector to its predetermined position within the housing; said locking means including both a resilient tab protruding downwardly from the top interior surface of the housing and at least one stop rising from the bottom interior surface to the top interior surface of the housing; and clip means for connection of the housing to a flat plate and having at least two resilient members protruding from the housing, each of said at least two resilient members having a beveled distal end and a ledge located on the outside portion of said member.

10. An enclosure for a thermal protector comprising:

an electrically insulating hollow housing having an open front end, an open rear end, a top interior surface, a bottom interior surface, locking means for securing the thermal protector to a predetermined position within the housing and side walls with stepped interior surfaces for guiding in combination with the bottom interior surface the thermal protector to its predetermined position within the housing; said locking means including both a resilient tab protruding downwardly from the top interior surface of the housing and at least one stop rising from the bottom interior surface; and clip means for connection of the housing to a flat plate and having three resilient members protruding from the housing and operable for engagement with an object.

* * * * *